(12) United States Patent
Kobayashi

(10) Patent No.: US 7,755,112 B2
(45) Date of Patent: Jul. 13, 2010

(54) FIELD EFFECT TRANSISTOR WITH AIR BRIDGE

(75) Inventor: Masaki Kobayashi, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 43 days.

(21) Appl. No.: 12/174,664

(22) Filed: Jul. 17, 2008

(65) Prior Publication Data

US 2008/0277698 A1 Nov. 13, 2008

Related U.S. Application Data

(63) Continuation of application No. PCT/JP2007/000758, filed on Jul. 12, 2007.

(30) Foreign Application Priority Data

Jul. 12, 2006 (JP) .............................. 2006-191928

(51) Int. Cl.
*H01L 29/772* (2006.01)

(52) U.S. Cl. .............................. 257/256; 257/E29.226; 257/E29.242; 438/619

(58) Field of Classification Search ................. 257/276, 257/256, 279, E29.226, E29.242, E29.319; 438/619
See application file for complete search history.

(56) References Cited

U.S. PATENT DOCUMENTS 5,821,154 A 10/1998 Nashimoto et al.
6,020,613 A * 2/2000 Udomoto et al. ............ 257/341
6,424,006 B1 7/2002 Ponse
6,713,793 B1 * 3/2004 Suzuki et al. ................ 257/276
2004/0188758 A1 * 9/2004 Inoue et al. .................. 257/341

FOREIGN PATENT DOCUMENTS

| DE | 195 22 364 C1 | 7/1996 |
|----|---------------|--------|
| JP | 07-288299 | 10/1995 |
| JP | 07-321342 A | 12/1995 |
| JP | 09-008064 A | 1/1997 |
| JP | 10-092847 A | 4/1998 |
| JP | 2004-022662 A | 1/2004 |

\* cited by examiner

*Primary Examiner*—Matthew Smith
*Assistant Examiner*—Michele Fan
(74) *Attorney, Agent, or Firm*—Oblon, Spivak, McClelland, Maier & Neustadt, L.L.P.

(57) ABSTRACT

A field effect transistor includes a channel region fabricated on a compound semiconductor substrate, a gate electrode fabricated on the channel region, a source electrode and a drain electrode alternately arranged on the channel region with a gate electrode interposed between the source electrode and the drain electrode, a bonding pad to be connected with an external circuit; and an air-bridge connected with the bonding pad. The air-bridge includes an electrode contact terminal to be connected with the source electrode or the drain electrode and an aerial circuit line for connecting the electrode contact terminal with a contact terminal of the bonding pad, the widthwise cross sectional area of the electrode contact terminal being equal to or less than that of the aerial circuit line.

14 Claims, 2 Drawing Sheets

FIELD EFFECT TRANSISTOR WITH AIR BRIDGE

CROSS-REFERENCE TO RELATED APPLICATION

This application is based upon and claims the benefit of priority from International Application No. PCT/JP2007/000758, filed on Jul. 12, 2007, which is based upon and claims the benefit of priority from the prior Japanese Patent Application No. 2006-191928, filed on Jul. 12, 2006, the entire contents of which are incorporated herein by reference.

TECHNICAL FIELD

The present invention relates to a field effect transistor of, for example, multi-finger type.

BACKGROUND ART

In recent years, with remarkable progress of inverter circuits and switching devices in performance, further improvement in high frequency characteristics and reliability is required for a field effect transistor, hereinafter referred to as FET.

Therefore, for instance, a multi-finger FET is used with a gate circuit line fabricated in parallel to a channel region, being connected with a plurality of gate fingers fabricated so as to cross the channel region, and a source circuit line or drain circuit line for connecting a bonding pad with a source electrode or a drain electrode fabricated on the channel region. The gate circuit line intersects with the source circuit line or the drain circuit line, however to insulate them, a passivation layer of SiN or the like is fabricated on the gate circuit line. However, by thus forming the circuit lines directly on the passivation layer of SiN or the like having high dielectric constant, stray capacitance is generated. Particularly, in a high-frequency region, the stray capacitance is not negligible. Accordingly, to reduce the stray capacitance, there has been used an air-bridge structure, in which an upper layer circuit line is fabricated over an air gap (see patent documents 1).

In this type of air-bridge structure, source/drain electrodes are composed of a metal layer of, for example, Pt/AuGe layers, which have ohmic contacts with the channel region, and a metal layer of, for example, Au/Pt/Ti layers piled on the metal layer having ohmic contacts. On the whole surface of the metal layers, regions for source/drain bonding pads and a connecting region between them (an air-bridge), for example, a single plated layer of Au is fabricated. Au composing the air-bridge has a higher thermal expansion coefficient than GaAs substrate. Accordingly, temperature changes, from a plating temperature (e.g. 60° C.) to an energizing temperature (e.g. 225° C. which is the burn-in temperature) or to a non-energizing temperature (e.g. 25° C. which is the room temperature), and hence thermal expansion or thermal contraction causes at the air-bridge. Such thermal expansion or thermal contraction generates a large internal stress such as compressive stress or tensile stress in the channel region. Thus, the internal stress causes problems of degradation of output power or low reliability.

[Patent Document 1]

Japanese Patent Application laid-Open No. 9-8064 (e.g. FIG. 1)

SUMMARY OF THE INVENTION

According to an aspect of the present invention, there is provided a field effect transistor including, an channel region fabricated on a compound semiconductor substrate, a gate electrode fabricated on the channel region, a source electrode and a drain electrode alternately arranged on the channel region with a gate electrode interposed between the source electrode and the drain electrode, a bonding pad to be connected with an external circuit, and an air-bridge, which is connected with the bonding pad, having an electrode contact terminal to be connected with the source electrode or the drain electrode and an aerial circuit line for connecting the electrode contact terminal with a contact terminal of the bonding pad, the widthwise cross sectional area of the electrode contact terminal being equal to or less than that of the aerial circuit line.

According to another aspect of the present invention, there is provided a field effect transistor including an channel region fabricated on a compound semiconductor substrate, a gate electrode fabricated on the channel region, a source electrode and a drain electrode alternately arranged on the channel region with a gate electrode interposed between the source electrode and the drain electrode, a bonding pad to be connected with an external circuit, and an air-bridge, which is connected with the bonding pad, having an electrode contact terminal to be connected with the source electrode or the drain electrode and an aerial circuit line for connecting the electrode contact terminal with a contact terminal of the bonding pad, the width of the electrode contact terminal being narrower than that of the aerial circuit line.

DETAILED DESCRIPTION OF THE EMBODIMENTS

Referring now to the accompanying drawings, one embodiment of the present invention will be described below.

Figure 1:
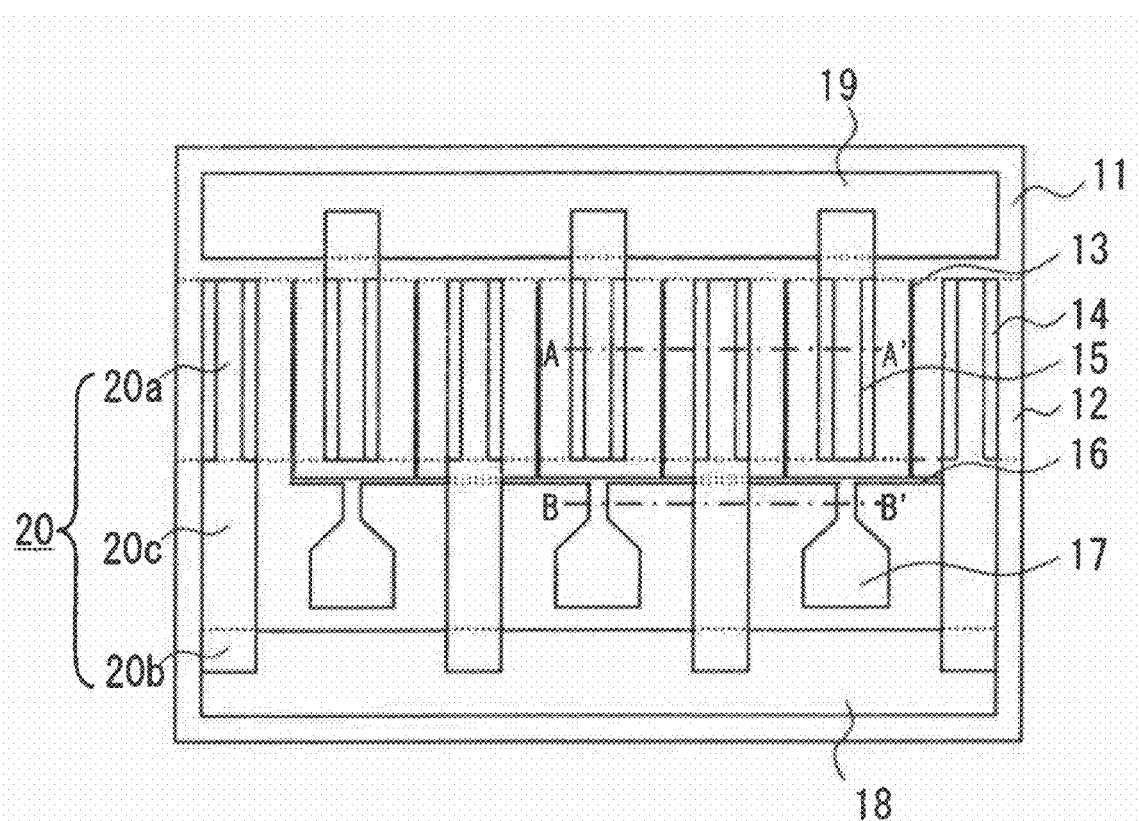
FIG. 1 is a top view of a multi-finger type FET device according to one embodiment of the present invention.
Figure 2A:
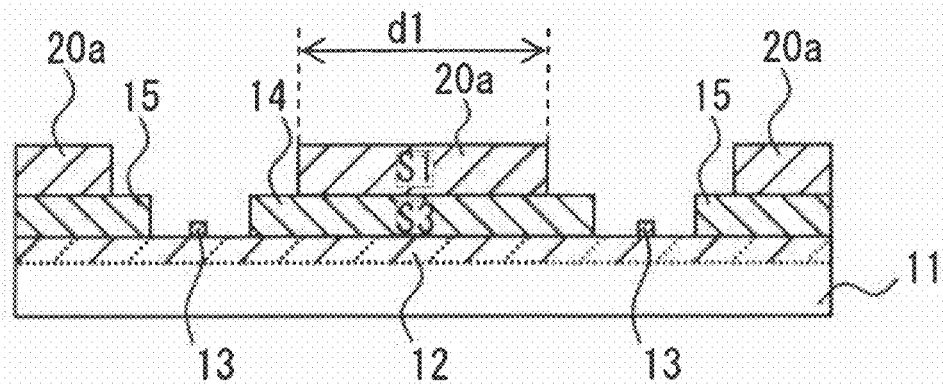
FIG. 2A is a sectional view taken along line A-A' of FIG. 1.
Figure 2B:
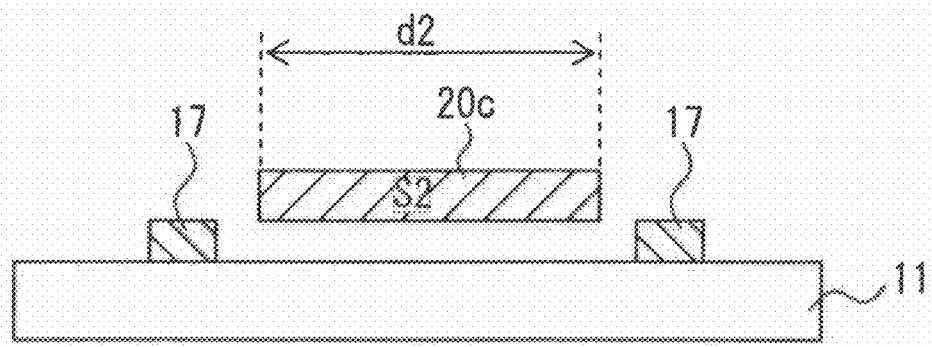
FIG. 2B is a sectional view taken along line B-B' of FIG. 1.

FIG. 1 is a top view of a multi-finger type FET device according to the present embodiment, FIG. 2A is a sectional view taken along line A-A' of FIG. 1 and FIG. 2B is a sectional view taken along line B-B' of FIG. 1. As illustrated, a channel region 12 is fabricated on a compound semiconductor substrate 11 and gate electrodes 13 are fabricated on the channel region 12. On a region including the channel region 12, a plurality of source electrodes 14 and a plurality of drain electrodes 15 are alternately arranged with the gate electrodes interposed between the source electrodes and the drain electrodes. The source electrodes 14 and the drain electrodes 15 are structured by sequentially layering ohmic contacts of, for example, Pt/AuGe and a metal layer of, for example, Au/Pt/Ti. The gate electrode 13 is connected with a gate pad 17 via a gate circuit line 16, the gate pad is for bonding to the outside to input signal. A source pad 18 is fabricated on the gate pad 17 side and, a drain pad 19 is fabricated on the opposite side across the channel region from the gate pad 17 and the source pad 18.

An air-bridge 20 constructed by, for example, Au plated layer is fabricated so as to connect the source electrode 14 with the source pad 18, or the drain electrode 15 with the drain pad 19, respectively. The air-bridge 20 is in no contact with the gate circuit line 16 and a passivation layer (not illustrated) of SiN layer or the like. The air-bridge 20 includes an electrode contact terminal 20a to be connected with the source electrode or the drain electrode, a pad contact terminal 20b to be connected with the source pad 18 or the drain pad 19 and an aerial circuit line 20c for connecting the electrode contact terminal 20a with the pad contact terminal 20b.

As illustrated in FIGS. 2A and 2B, a width $d_1$ of the electrode contact terminal 20a is narrower than a width $d_2$ of the aerial circuit line 20c. In the widthwise cross section of the each air-bridge 20, an area $S_1$ of cross sectional region of the electrode contact terminal 20a is equal to or less than an area $S_2$ of cross sectional region of the aerial circuit line 20c. Sum of the cross sectional area $S_1$ of the electrode contact terminal 20a and an area $S_3$ of cross sectional region of the source electrode 14 or the drain electrode 15 is equal to or more than the area $S_2$ of cross sectional region of the aerial circuit line 20c.

This type of structure minimize a cross sectional area and/or a width of the electrode contact terminal 20a, and can reduce the large internal stress such as compressive stress or tensile stress to some degree in the source electrode 14, the drain electrode 15 and the channel region 12 at the lower layer thereof, even if fluctuating temperature cause the Au layer thermal expansion or thermal contraction. Accordingly, this type of structure can restrain degradation of output power even in a high frequency region, and can achieve high reliability.

By getting sum of the area of the cross sectional region of the electrode contact terminal 20a and the area of the cross sectional region of the source electrode 14 or the drain electrode 15 to be equal to or more than the area of the cross sectional region the aerial circuit line 20c, the FET device can ensure a current capacity value in an operating current path. Thus the current path withstands operating current without causing a problem such as burn-out. Thereby a problem such as degraded output characteristics can be restrained even in a high frequency region, thus achieving high reliability.

In the present embodiment, the width $d_1$ of the electrode contact terminal 20a is set to be narrower than a width $d_2$ of the aerial circuit line 20c. Stress such as compressive stress or tensile stress is concentrated at (inner side of) the corners of the steps of the electrode. By reducing the width of the electrode contact terminal 20a, two steps are realized between contact terminal 20a and the GaAs substrate. Accordingly, these stresses are distributed to each corner of the steps, thus restraining an adverse effect upon output power characteristics. It is desirable that ratio $d_1/d_2$ is equal to or less than 60% in order to minimize the stress effectively. On the contrary, if the value is too small, stress is concentrated at (inner side of) the corners of the steps of the electrode contact terminal 20a, and then Au plated layer may be peeled off. It is preferable that $d_1/d_2$ is at least 40%.

It is not required that the width d1 of the electrode contact terminal 20a should be constant, the electrode contact terminals 20a may have slopes in the vicinity of a boundary portion to the aerial circuit lines 20c or in whole part. However, it is required that the area S1 of the cross sectional region of the electrode contact terminal 20a in the air-bridge 20 is equal to or less than the area S2 of the cross sectional region of the aerial circuit line 20c.

Figure 3:
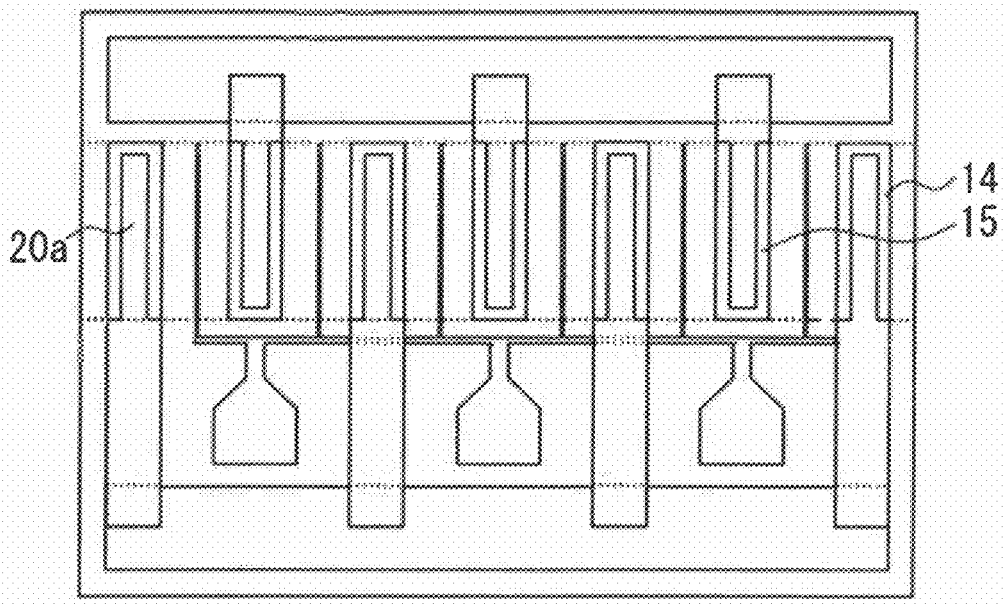
FIG. 3 is a top view of a multi-finger FET device according to one embodiment of the present invention.

In the present embodiment, the electrode contact terminal 20a fabricated on the source electrode 14 and the drain electrode 15, reach to the edges of the source electrode 14 and the drain electrode 15. As illustrated in a top view of FIG. 3, it is not always necessary that the electrode contact terminal is fabricated up to the edges. By way of having steps at the edges, an adverse effect of stress upon the passivation layer deposited on the upper layer can be minimized.

The pad contact terminal 20b may be in any form as long as it is connected with the source pad 18 or the drain pad 19. The source pad 18 and the drain pad 19 may be fabricated integrally with the air-bridge 20.

A compound semiconductor substrate of GaAs is adopted, but a compound semiconductor substrate is not limited thereto and, a compound semiconductor substrate made of another material such as GaN or SiC can be used. Epitaxial wafer can be also adopted. Further, a heavily doped layer can be fabricated as a lower layer of the ohmic contact of each electrode by ion-implantation or formation of a heavily doped epitaxial layer.

These structures can be applied to FETs such as MESFET (Metal Semiconductor Field Effect Transistor) and MOSFET (Metal Oxide Semiconductor Field Effect Transistor) in addition to HEMT (High Electron Mobility Transistor).

The present invention is not limited to the foregoing embodiment and various changes and modifications may be made without departing from the spirit and scope of the present invention.

The invention claimed is:

1. A field effect transistor comprising:
 a channel region fabricated on a compound semiconductor substrate;
 a gate electrode fabricated across a surface of the channel region;
 a source electrode and a drain electrode alternately arranged on the channel region with a gate electrode interposed between the source electrode and the drain electrode;
 a bonding pad to be connected with an external circuit; and
 an air-bridge connected with the bonding pad, the air-bridge including an electrode contact terminal to be connected with the source electrode or the drain electrode and to be arranged along a longer direction of the source electrode or the drain electrode, a pad contact terminal connected with the bonding pad, and an aerial circuit line for connecting the electrode contact terminal with the pad contact terminal,
 wherein a cross sectional area of the electrode contact terminal in a direction perpendicular to a connecting direction of the pad contact terminal, the aerial circuit line, and the electrode contact terminal is equal to or less than a cross-sectional area of the aerial circuit line.

2. The field effect transistor according to claim 1, wherein in the widthwise cross section of the each air-bridge, a total of the cross sectional area of the electrode contact terminal and the cross sectional area of the source electrode or the drain electrode is equal to or more than the cross sectional area of the aerial circuit line.

3. The field effect transistor according to claim 1, wherein the air-bridge includes an Au layer.

4. The field effect transistor according to claim 1, wherein the compound semiconductor substrate is a GaAs substrate.

5. The field effect transistor according to claim 1, wherein the source electrode and the drain electrode are arranged with the gate electrodes interposed between the source electrode and the drain electrode and the respective numbers of the source electrode, drain electrode and the gate electrode are at least two.

6. The field effect transistor according to claim 1, wherein the bonding pad includes a source pad, a drain pad and a gate pad, and the source electrode is connected with the source pad, the drain electrode is connected with the drain pad and the gate electrode is connected with the gate pad.

7. The field effect transistor according to claim 6, wherein the source pad, the drain pad and the gate pad are respectively connected with the source electrode, the drain electrode and the gate electrode the respective number of which are at least two.

8. A field effect transistor comprising:
   a channel region fabricated on a compound semiconductor substrate;
   a gate electrode fabricated across a surface of the channel region;
   a source electrode and a drain electrode alternately arranged on the channel region with a gate electrode interposed between the source electrode and the drain electrode;
   a bonding pad to be connected with an external circuit; and
   an air-bridge connected with the bonding pad, the air-bridge having an electrode contact terminal to be connected with the source electrode or the drain electrode and to be arranged along a longer direction of the source electrode or the drain electrode, and an aerial circuit line for connecting the electrode contact terminal with a contact terminal of the bonding pad,
   wherein the width of the electrode contact terminal along a connecting direction of the pad contact terminal, the aerial circuit line, and the electrode contact terminal is narrower than that of the aerial circuit line.

9. The field effect transistor according to claim 8, wherein the width of the electrode contact terminal is at least 40% and at most 60% of that of the aerial circuit line.

10. The field effect transistor according to claim 8, wherein the air-bridge has an Au layer therein.

11. The field effect transistor according to claim 8, wherein the compound semiconductor substrate is a GaAs substrate.

12. The field effect transistor according to claim 8, wherein the source electrode and the drain electrode are arranged with the gate electrode interposed between the source electrode and the drain electrode and the respective numbers of the source electrode, drain electrode and the gate electrode are at least two.

13. The field effect transistor according to claim 8, wherein the bonding pad includes a source pad, a drain pad and a gate pad and the source electrode is connected with the source pad, the drain electrode is connected with the drain pad and the gate electrode is connected with the gate pad.

14. The field effect transistor according to claim 13, wherein the source pad, the drain pad or the gate pad are respectively connected with source electrode, the drain electrode and the gate electrode the respective number of which are at least two.

* * * * *